United States Patent
Ker et al.

(10) Patent No.: US 7,532,047 B2
(45) Date of Patent: May 12, 2009

(54) MIXED-VOLTAGE INPUT/OUTPUT BUFFER

(75) Inventors: Ming-Dou Ker, Hsinchu (TW);
Fang-Ling Hu, Jiaosi Township, Yilan County (TW)

(73) Assignee: National Chiao-Tung University, Hsinchu (TW)

( * ) Notice: Subject to any disclaimer, the term of this patent is extended or adjusted under 35 U.S.C. 154(b) by 53 days.

(21) Appl. No.: 11/673,615

(22) Filed: Feb. 12, 2007

(65) Prior Publication Data
US 2008/0157818 A1 Jul. 3, 2008

(30) Foreign Application Priority Data
Dec. 29, 2006 (TW) .............................. 95149776 A

(51) Int. Cl.
*H03K 3/00* (2006.01)
(52) U.S. Cl. .................... 327/108; 327/112; 326/82; 326/85
(58) Field of Classification Search ......... 327/108–112; 329/82–87
See application file for complete search history.

(56) References Cited

U.S. PATENT DOCUMENTS 6,320,414 B1   11/2001  Annema et al.
6,509,787 B1 *  1/2003  Kang ........................ 327/541

OTHER PUBLICATIONS

Anne-Johan Annema, et al, 5.5V I/O in a 2.5-V 0.25-µm CMOS Technology, IEEE Journal, vol. 36 No. 3, Mar. 2001.

* cited by examiner

*Primary Examiner*—An T Luu
(74) *Attorney, Agent, or Firm*—Ming Chow Sinorica, LLC

(57) ABSTRACT

A mixed-voltage I/O buffer comprises an input circuit, an output circuit, an I/O pad, a pre-driver circuit coupled to the output circuit, two added coupled N-type transistors, and a dynamical gate-controlled circuit coupled to each gate of the two N-type transistors and the pre-driver circuit; one of the N-type transistors is coupled to the input circuit and the output circuit; the other N-type transistor and the dynamic gate-controlled circuit are together coupled to the I/O pad. Thereby, a mixed-voltage I/O buffer which receives 2×VDD-tolerant input signals and overcomes the hot-carrier degradation is realized.

12 Claims, 4 Drawing Sheets

US 7,532,047 B2

MIXED-VOLTAGE INPUT/OUTPUT BUFFER

BACKGROUND OF THE INVENTION

1. Field of the Invention

The present invention relates to a mixed-voltage I/O buffer, particularly to a mixed-voltage I/O buffer that inhibits hot-carrier degradation.

2. Description of the Related Art

With the advance of technology and science, transistors become more and more miniaturized. Thus, the allowed maximum node voltage, such as the gate-source voltage (Vgs), the gate-drain voltage (Vgd), and the drain-source voltage (Vds), should be also decreased to guarantee the lifetime of the circuit.

At present, the chips fabricated with the advanced CMOS process still have to work together with the circuits fabricated with the earlier stage CMOS process. Thus, the transmission interface of the chips is likely to receive a voltage signal greater than the normal working voltage VDD thereof. The mixed-voltage I/O (Input/Output) buffer is commonly used in the transmission interface to receive a higher voltage signal and output a lower operating voltage to satisfy the requirements of high speed and low power consumption and guarantee circuit lifetime. Further, the mixed-voltage I/O buffer is usually realized with thinner gate-oxide transistors.

Refer to FIG. 1 a diagram schematically showing the circuit of a conventional mixed-voltage I/O buffer. As shown in FIG. 1, the I/O buffer 10 receives a GND-to-2×VDD input signal (high-level voltage) and transmits a GND-to-VDD output signal (low-level voltage). The I/O buffer 10 comprises a pre-driver circuit 12, an output circuit 14, an input circuit 16 and an I/O pad 18. According to an output-enable signal OE, the pre-driver circuit 12 sends out a pull-up signal PU or a pull-down signal PD to control the output circuit 14. During the transition from receiving a 2×VDD input signal to transmitting a 0V (GND) output signal, the voltage of the I/O pad 18 is 2×VDD initially; as the NMOS transistor 144 is turned on during the transition, the source voltage of the NMOS transistor 142 is pulled down to about Vdsat (the saturated drain voltage). Thus, during the transition from receiving a 2×VDD input signal to transmitting a 0V (GND) output signal, the drain-source voltage Vds of the NMOS transistor 142 is larger than the maximum operating voltage, and the hot-carrier degradation occurs. Since the transistors feature extremely short channel length and high electric field in the deep sub-micron technologies, the hot-carrier-induced degradation becomes one of the most important reliability concerns.

SUMMARY OF THE INVENTION

One objective of the invention is to provide a mixed-voltage I/O buffer, which is achieved with thin-oxide devices to receive 2×VDD-tolerant input signals. The 2×VDD-tolerant I/O buffer is designed with a dynamic gate-controlled circuit and two blocking NMOS transistors to overcome the problems of gate oxide reliability, current leakage and hot-carrier degradation.

Another objective of the invention is to provide a mixed-voltage I/O buffer, which incorporate a voltage slew-rate control output circuit in a mixed-voltage I/O buffer to form an I/O buffer with voltage slew-rate control to reduce the ground-bounce effect.

To achieve the abovementioned objectives, the present invention proposes a mixed-voltage I/O buffer, which comprises a first N-type transistor coupled to a second N-type transistor, a dynamic gate-controlled circuit, an output circuit, and a pre-driver circuit. The first N-type transistor is coupled to an input circuit, and the second N-type transistor is coupled to an I/O pad. The dynamic gate-controlled circuit is coupled to the I/O pad, the gates of the two N-type transistors, and externally coupled to a high-level voltage. The output circuit is coupled to the first N-type transistor, the input circuit, and externally coupled to a low-level voltage. The pre-driver circuit is coupled to the output circuit and the gate-controlled circuit and controls the voltage of the output circuit according to an output-enable signal and input data.

Further, when the output circuit of the abovementioned mixed-voltage I/O buffer is a voltage slew-rate control output circuit with a plurality of parallel pull-up P-type transistors and a plurality of parallel pull-down N-type transistors, the I/O buffer has the function of voltage slew-rate control to reduce the ground-bounce effect.

To enable the objectives, technical contents, characteristics and accomplishments of the present invention to be easily understood, the embodiments of the present invention are to be described in detail in cooperation with the attached drawings below.

DETAILED DESCRIPTION OF THE INVENTION

The present invention discloses a 2×VDD-tolerant mixed-voltage I/O buffer, wherein the circuit thereof adopts transistors with a thinner gate oxide layer.

Figure 1:
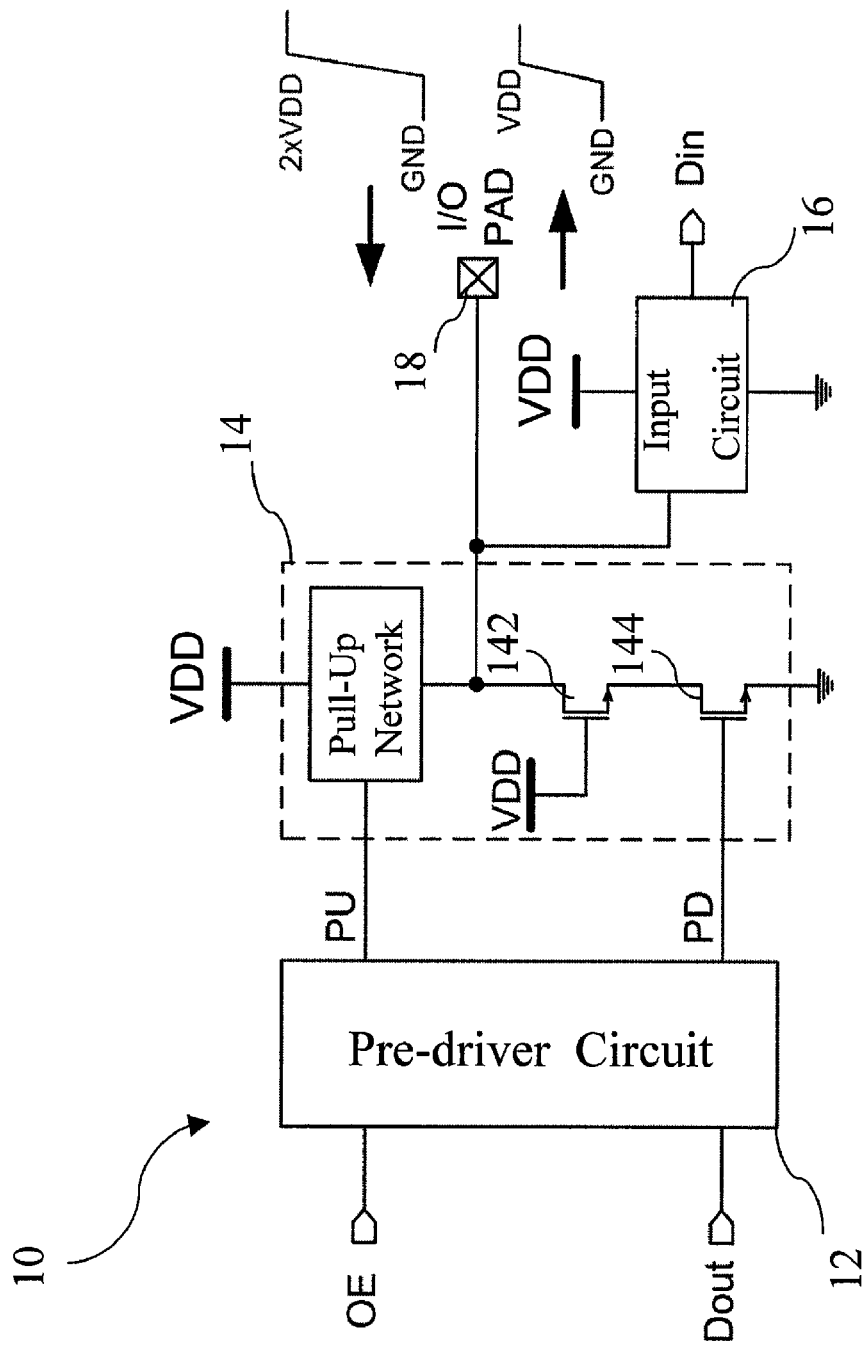
FIG. 1 is a diagram schematically showing the circuit of a conventional mixed-voltage I/O buffer.
Figure 2:
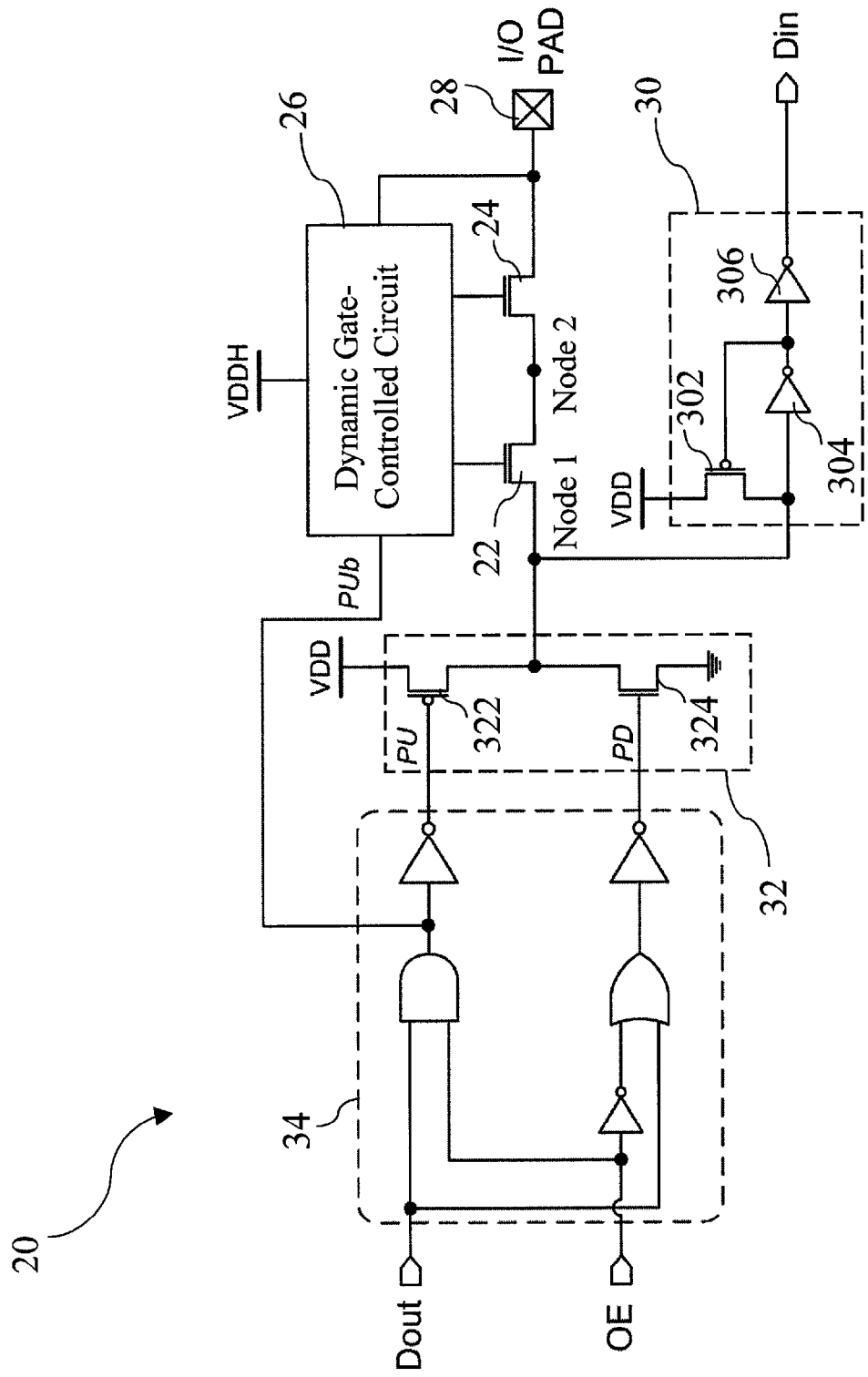
FIG. 2 is a diagram schematically showing the circuit of the mixed-voltage I/O buffer according to a first embodiment of the present invention.

Refer to FIG. 2 a diagram schematically showing the circuit of the mixed-voltage I/O buffer according to a first embodiment of the present invention. In FIG. 2, the mixed-voltage I/O buffer 20 comprises two NMOS transistors 22 and 24, a dynamic gate-controlled circuit 26, an input circuit 30, an output circuit 32 and a pre-driver circuit 34. The dynamic gate-controlled circuit 26 is coupled to the gates of the two NMOS transistor 22 and 24, and externally coupled to a high-level voltage VDDH. An I/O pad 28 is coupled to the dynamic gate-controlled circuit 26 and the drain of the NMOS transistor 24. The output circuit 32 is coupled to the input circuit 30 and the source of the NMOS transistor 22 at Node 1, and is externally coupled to a low-level voltage VDD. The pre-driver circuit 34 is coupled to the output circuit 32 and the gate-controlled circuit 26. According to an output-enable signal OE, the pre-driver circuit 34 outputs a pull-up signal PU to control a pull-up PMOS transistor 322, and outputs a pull-down signal PD to control a pull-down NMOS transistor 324 of the output circuit 32. The NMOS transistor 22 is coupled to the NMOS transistor 24 at Node 2. The input circuit 30 comprises a PMOS transistor 302 and two inverters 304 and 306. The drain of the PMOS transistor 302 and the input the inverter 304 are coupled to Node 1. The output end of the inverter 304 is coupled to the gate of the PMOS transistor 302 and the input end of the inverter 306. In the output circuit 32, the pull-up PMOS transistor 322 is externally coupled to a low-level voltage VDD, and the pull-down NMOS transistor 324 is grounded.

Figure 3:
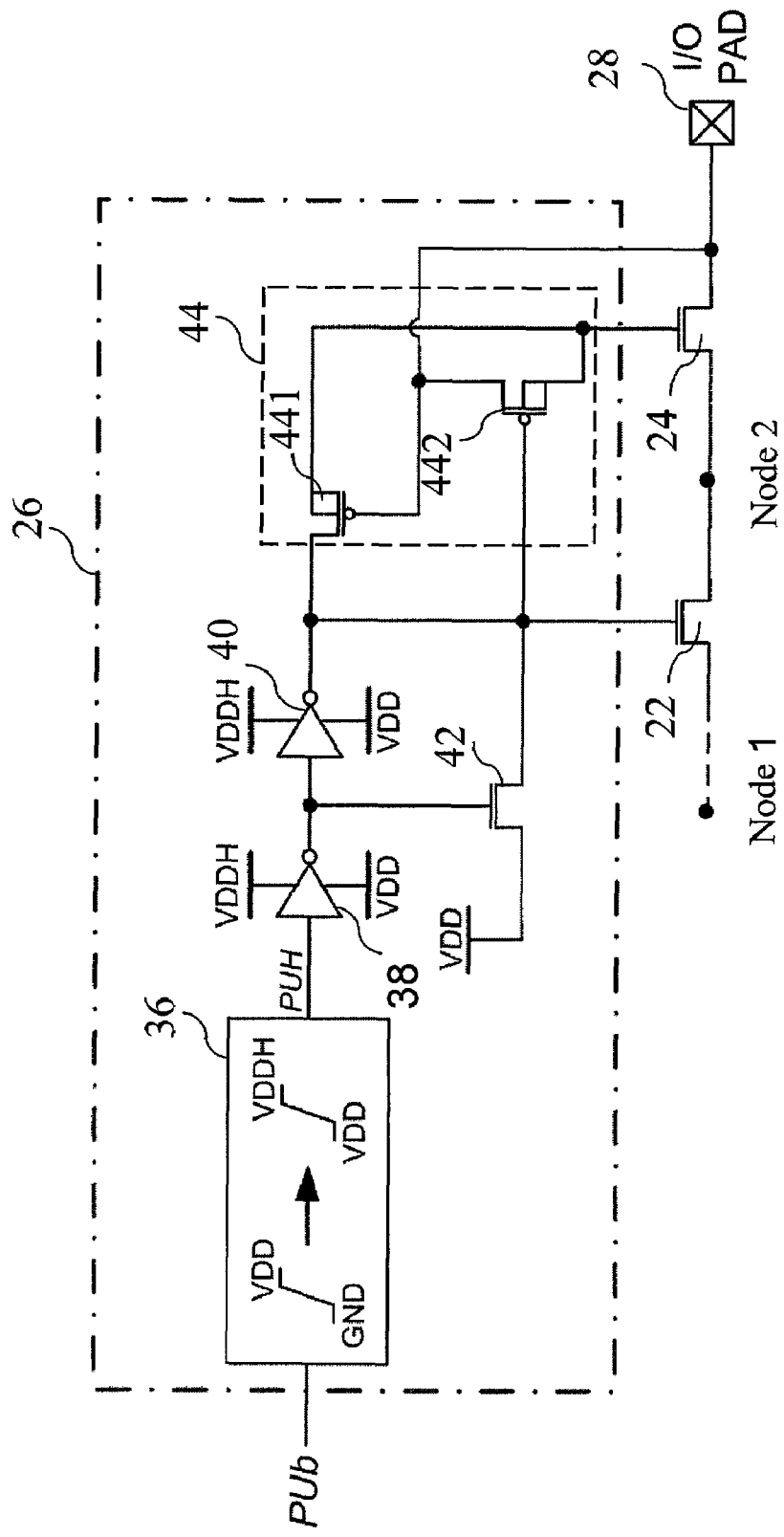
FIG. 3 is a diagram schematically showing the dynamic gate-controlled circuit according to the first embodiment of the present invention.

Refer to FIG. 3 a diagram schematically showing the dynamic gate-controlled circuit according to the first embodiment of the present invention. In FIG. 3, the dynamic gate-controlled circuit 26 comprises a level shifter 36, two coupled inverters 38 and 40, a NMOS transistor 42, and a gate-tracking circuit 44. A level shifter 36 is coupled to the pre-driver circuit 34 and receives a voltage signal PUb output by the pre-driver circuit 34 and pulls up the voltage signal PUb to be a voltage signal PUH. The input end of the inverter 38 is coupled to the level shifter 36, and the output end of the inverter 38 is coupled to a gate of the NMOS transistor 42 and the inverter 40. The gate-tracking circuit 44 further comprises two coupled PMOS transistors 441 and 442. The gate-tracking circuit 44 is coupled to the inverter 40, the drain of the NMOS transistor 42, the gate of the NMOS transistor 22, the gate of the NMOS transistor 24, and the I/O pad 28. The bulks of the PMOS transistors 441 and 442 are coupled to the gate of the NMOS transistor 24 to maintain the bulks at a high-level voltage lest current leakage occur.

When the output-enable signal OE received by the pre-driver circuit 34 is a low-level voltage (0V), the mixed-voltage I/O buffer 20 is in a receive mode, and the I/O pad 28 receives an input signal and transmits the signal to the input end Din of the input circuit 30. In the receive mode, the pre-driver circuit 34 turns off the pull-up PMOS transistor 322 and the pull-down NMOS transistor 324 of the output circuit 32 and outputs a 0V voltage signal PUb to the dynamic gate-controlled circuit 26, and the level shifter 36 of the dynamic gate-controlled circuit 26 transforms the voltage signal PUb into a VDD-level voltage signal PUH. Thus, the gate of the NMOS transistor 22 is biased at a voltage of VDD via the inverter 40, and the NMOS transistor 42 makes the gate of the NMOS transistor 22 more stably biased at a voltage of VDD. Consequently, the gate voltage of the NMOS transistor 22 is always biased at VDD in the receive mode. The gate-tracking circuit 44 is coupled to the gate of the NMOS 24 transistor, and the gate voltage of the NMOS transistor 24 thus is dependent on the voltage of the I/O pad 28 in the receive mode.

Refer to table.1. When the I/O buffer 20 receives a 0V input signal in the receive mode, the gate of the NMOS transistor 22 is biased at a voltage of VDD, and the gate of the NMOS transistor 24 is also biased at the voltage of VDD; Node 1 and Node 2 are discharged to 0V via the NMOS transistors 22 and 24, and a 0V input signal is transmitted from the I/O pad 28 to the input end Din of the input circuit 30. When the I/O buffer 20 receives a 2×VDD input signal in the receive mode, the gate of the NMOS transistor 22 is still biased at the voltage of VDD, but the gate of the NMOS transistor 24 is biased at a voltage of 2×VDD; Node 1 is biased at the voltage of VDD via the feedback operation of the PMOS transistor 302 of the input circuit 30 and Node 2 is biased at a voltage of (2×VDD−ΔV) to enable 1×VDD input signal transmitted from the I/O pad 28 to the input end Din of the input circuit 30 via the NMOS transistors 22 and 24.

TABLE 1

| Operating Mode | I/O Pad 28 | The Gate of NMOS Transistor 22 | The Gate of NMOS Transistor 24 |
| --- | --- | --- | --- |
| Receive Mode | Low (0 V) | VDD | VDD |
| Receive Mode | High (2×VDD) | VDD | High (2×VDD) |
| Transmit Mode | Low (0 V) | VDD | VDD |
| Transmit Mode | High (VDD) | 2×VDD | 2×VDD |

When the output-enable signal OE received by the pre-driver circuit 34 is a high-level voltage signal (VDD), the I/O buffer 20 is in a transmit mode, and an output signal is transmitted from the output end Dout of the pre-driver circuit 34 to an output signal to the I/O pad 28. When the output end Dout of the pre-driver circuit 34 sends out a 0V output signal in the transmit mode, the pre-driver circuit 34 turns off the pull-up PMOS transistor 322 of the output circuit 32 and turns on the pull-down NMOS transistor 324 and then a 0V voltage signal PUb is transmitted to the dynamic gate-controlled circuit 26 and transformed into a VDD voltage signal PUH by the level shifter 36 of the dynamic gate-controlled circuit 26. The gates of the NMOS transistors 22 and 24 are biased at a voltage of VDD, as shown in Table.1, to enable a 0V output signal transmitted from the output end Dout of the pre-driver circuit 34 to the I/O pad 28. When the output end Dout of the pre-driver circuit 34 sends out a VDD output signal in the transmit mode, the pre-driver circuit 34 turns on the pull-up PMOS transistor 322 of the output circuit 32 and turns off the pull-down NMOS transistor 324 and then a VDD voltage signal PUb is transmitted to the dynamic gate-controlled circuit 26 and transformed into a 2×VDD voltage signal PUH by the level shifter 36 of the dynamic gate-controlled circuit 26. As shown in Table.1, the gates of the NMOS transistors 22 and 24 are biased at a voltage of 2×VDD to enable a VDD output signal transmitted from the output end Dout of the pre-driver circuit 34 to the I/O pad 28.

During the transition from receiving a 2×VDD input signal to transmitting a 0V output signal in the mixed-voltage I/O buffer 20, Node 1 and Node 2 are respectively at voltages of VDD and (2×VDD−ΔV) initially. During the transition, the pull-down signal PD generated by the pre-driver circuit 34 turns on the NMOS transistor 324 of the output circuit 32 and the NMOS transistor 22 is turned on when its source voltage is pulled down by the NMOS transistor 324. Then, the NMOS transistor 24 is turned on and the voltage at the I/O pad 28 is pulled down. The drain-source voltages Vds of the NMOS transistors 22 and 24 will not exceed the maximum voltage defined in a given fabrication process. Therefore, no matter whether it is in the receive mode, in the transmit mode or during the transition from receiving a 2×VDD input signal to transmitting a 0V output signal, the mixed-voltage I/O buffer 20 of the present invention is free from gate-oxide deterioration and hot-carrier degradation.

Figure 4:
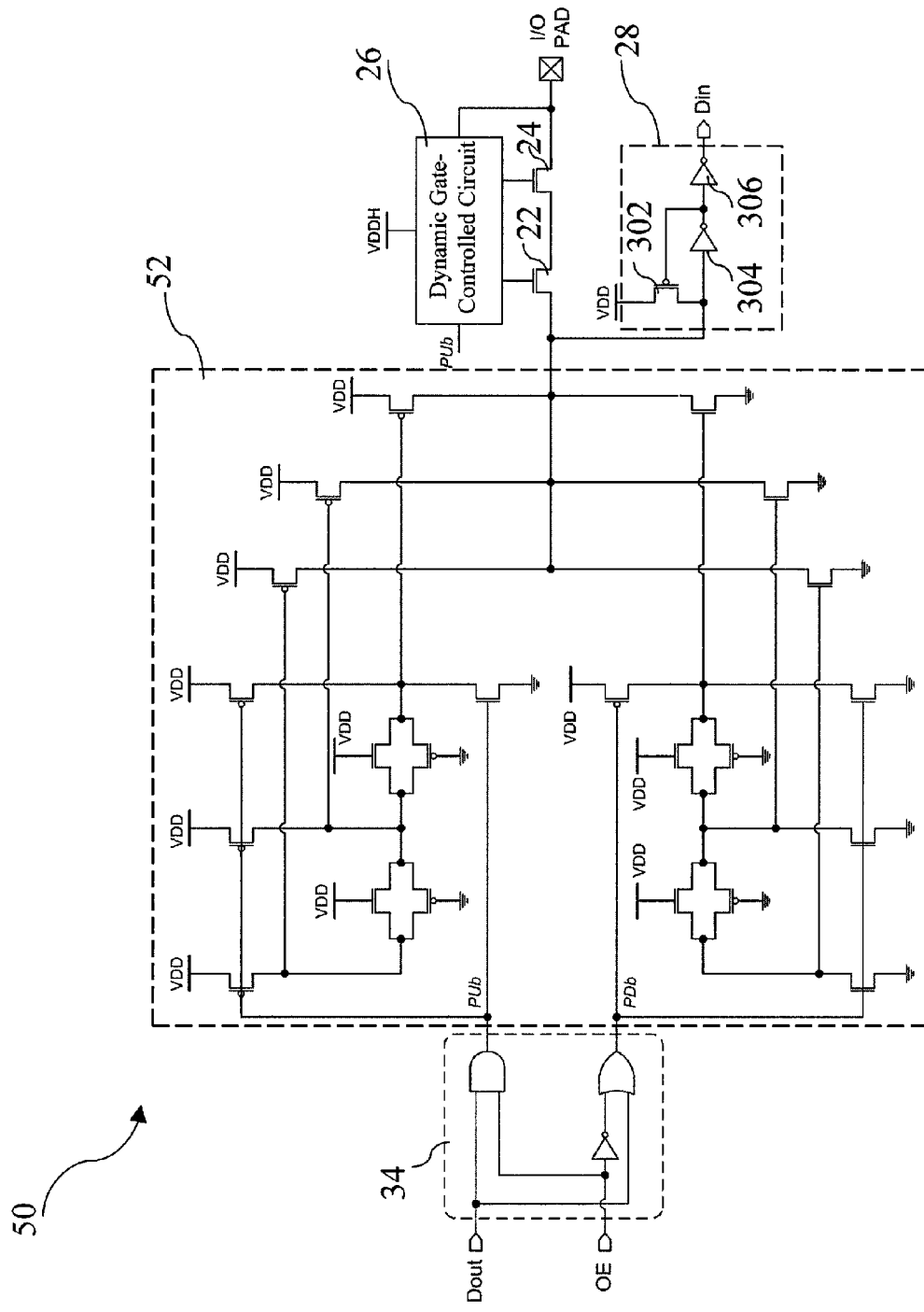
FIG. 4 is a diagram schematically showing the circuit of the mixed-voltage I/O buffer according to a second embodiment of the present invention.

Refer to FIG. 4 a diagram schematically showing the circuit of the mixed-voltage I/O buffer 50 according to a second embodiment of the present invention, wherein a voltage slew-rate control output circuit 52 replaces the output circuit 32 shown in FIG. 2. In FIG. 4, the mixed-voltage I/O buffer 50 of the present invention is a mixed-voltage I/O buffer with a voltage slew-rate control function and implemented with a voltage slew-rate control output circuit 52, which has a plurality of parallel pull-up PMOS transistors and a plurality of parallel pull-down NMOS transistors. Thereby, the mixed-voltage I/O buffer 50 improves the problem of the ground bounce effect.

In summary, the present invention proposes a 2×VDD-tolerant mixed-voltage I/O buffer. No matter whether it is in the receive mode, in the transmit mode or during the transition from receiving a 2×VDD input signal to transmitting a 0V output signal, via two NMOS transistors and a dynamic gate-controlled circuit, the mixed-voltage I/O buffer of the present invention is free from the problems of gate-oxide reliability, current leakage and hot-carrier degradation. Further, the present invention incorporates a voltage slew-rate control output circuit in the mixed-voltage I/O buffer to realize a mixed-voltage I/O buffer with a voltage slew-rate control function.

Those described above are the embodiments to clarify the characteristics and technical thought of the present invention to enable the persons skilled in the art to understand, make and use the present invention. However, it is not intended to limit the scope of the present invention. Any equivalent modification or variation according to the spirit of the present invention is to be also included within the scope of the present invention.

What is claimed is:

1. A mixed-voltage input/output buffer, comprising:
   a first N-type transistor coupled to an input circuit;
   a second N-type transistor coupled to said first N-type transistor and an input/output pad;
   a dynamic gate-controlled circuit externally connected to a high-level voltage and coupled to said input/output pad, a gate of said first N-type transistor and a gate of said second N-type transistor;
   an output circuit externally connected to a low-level voltage and coupled to said first N-type transistor and said input circuit, wherein said output circuit is a voltage slew-rate control output circuit; and
   a pre-driver circuit coupled to said output circuit and said dynamic gate-controlled circuit and controlling a voltage of said output circuit according to an output-enable signal and input data.

2. The mixed-voltage input/output buffer according to claim 1, wherein said dynamic gate-controlled circuit further comprises:
   a level shifter coupled to said pre-driver circuit and receiving a voltage signal sent out by said pre-driver circuit and pulling up a level of said voltage signal;
   a first inverter, wherein one end of said first inverter is coupled to said level shifter, and an other end is coupled to a second inverter and a gate of a third N-type transistor; and
   a gate-tracking circuit coupled to said second inverter, said third N-type transistor, said gate of said first N-type transistor, said gate of said second N-type transistor and said input/output pad.

3. The mixed-voltage input/output buffer according to claim 2, wherein said gate-tracking circuit further comprises two first P-type transistors, which are coupled to each other.

4. The mixed-voltage input/output buffer according to claim 1, wherein said output circuit further comprises a pull-up P-type transistor and a pull-down N-type transistor.

5. The mixed-voltage input/output buffer according to claim 1, wherein said voltage slew-rate control output circuit further comprises a plurality of parallel pull-up P-type transistors and a plurality of parallel pull-down N-type transistors.

6. The mixed-voltage input/output buffer according to claim 1, wherein when said output-enable signal is high, said input/output buffer transmits an output signal from an output end of said pre-driver circuit transmits to said input/output pad.

7. The mixed-voltage input/output buffer according to claim 1, wherein said input circuit further comprises:
   a second P-type transistor coupled to said output circuit and said first N-type transistor;
   a third inverter coupled to said second P-type transistor, said output circuit and said first N-type transistor; and
   a fourth inverter coupled to said second P-type transistor and said third inverter.

8. The mixed-voltage input/output buffer according to claim 1, wherein when said output-enable signal is low, said input/output buffer transmits said input signal from said input/output pad to an input end of said input circuit, and said pre-driver circuit turns off said output circuit, and said gate of said first N-type transistor maintains biased at said low-level voltage, and said gate of said second N-type transistor varies with a voltage of said input/output pad.

9. The mixed-voltage input/output buffer according to claim 8, wherein when said input signal received by said input/output buffer is at 0V voltage, said gate of said second N-type transistor is biased at said low-level voltage to enable said input/output pad to transmit a 0V input signal to said input circuit.

10. The mixed-voltage input/output buffer according to claim 8, wherein when said input signal received by said input/output buffer is at said high-level voltage, said gate of said second N-type transistor is biased at double said low-level voltage to enable said input/output pad to transmit an input signal of said low-level voltage to said input circuit via said first and second N-type transistors.

11. The mixed-voltage input/output buffer according to claim 6, wherein when said output signal transmitted by the output end of said pre-driver circuit is at said low-level voltage, said pre-driver circuit turns on a pull-up P-type transistor of said output circuit and turns off a pull-down N-type transistor of said output circuit, and said gate of said first N-type transistor and said gate of said second N-type transistor are biased at double said low-level voltage to enable the output end of said pre-driver circuit to transmit an output signal of said low-level voltage to said input/output pad.

12. The mixed-voltage input/output buffer according to claim 6, wherein when said output signal transmitted by the output end of said pre-driver circuit is at 0V, said pre-driver circuit turns off a pull-up P-type transistor of said output circuit and turns on a pull-down N-type transistor of said output circuit, and said gate of said first N-type transistor and said gate of said second N-type transistor are biased at said low-level voltage to enable the output end of said pre-driver circuit to transmit a 0V output signal to said input/output pad.

* * * * *